(12) United States Patent
Kim et al.

(10) Patent No.: US 9,923,170 B2
(45) Date of Patent: Mar. 20, 2018

(54) ORGANIC LIGHT EMITTING DISPLAY DEVICE AND FABRICATING METHOD THEREOF

(71) Applicant: LG Display Co., Ltd., Seoul (KR)

(72) Inventors: Jongkyung Kim, Seoul (KR); Taro Hasumi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/918,820

(22) Filed: Oct. 21, 2015

(65) Prior Publication Data

US 2016/0133874 A1    May 12, 2016

(30) Foreign Application Priority Data

Nov. 7, 2014   (KR) .......................... 10-2014-0154512

(51) Int. Cl.
  *H01L 51/52* (2006.01)
  *H01L 27/32* (2006.01)

(52) U.S. Cl.
  CPC ...... *H01L 51/5259* (2013.01); *H01L 27/3241* (2013.01); *H01L 27/3246* (2013.01)

(58) Field of Classification Search
  None
  See application file for complete search history.

(56) References Cited

U.S. PATENT DOCUMENTS

| 5,882,761 A | 3/1999 | Kawami et al. |
| 2004/0081852 A1 | 4/2004 | Chen et al. |
| 2009/0130941 A1* | 5/2009 | Boroson ............. H01L 51/5237 445/25 |
| 2009/0289549 A1 | 11/2009 | Lee et al. |

(Continued)

FOREIGN PATENT DOCUMENTS

| CN | 101855744 A | 10/2010 |
| CN | 103872078 A | 6/2014 |

(Continued)

OTHER PUBLICATIONS

The First Office Action dated Jan. 23, 2018 from the State Intellectual Property Office of People's Republic of China in related Chinese application No. 201510740743.7.

*Primary Examiner* — Fernando L Toledo
*Assistant Examiner* — Valerie N Newton
(74) *Attorney, Agent, or Firm* — Morgan, Lewis & Bockius LLP

(57) ABSTRACT

An organic light emitting display device and a fabricating method thereof are disclosed, in which an organic light emitting diode or a cathode electrode may be prevented from being damaged by outgassing generated due to water remaining in a planarization film. The organic light emitting display device includes a substrate; a thin film transistor layer provided on the lower substrate; a planarization film provided on the thin film transistor layer to planarize the thin film transistor layer; an anode line provided on the planarization film to partially expose the planarization film in a non-display area corresponding to a periphery area of a display area; and a water absorption organic film provided on the exposed portion of the planarization film to at least partially absorb outgassing from the planarization film.

17 Claims, 15 Drawing Sheets

(56) References Cited

U.S. PATENT DOCUMENTS

| | | | |
|---|---|---|---|
| 2011/0156578 A1* | 6/2011 | Jeon | H01L 51/5253 |
| | | | 313/506 |
| 2014/0159002 A1* | 6/2014 | Lee | H01L 27/3246 |
| | | | 257/40 |
| 2016/0315135 A1* | 10/2016 | Choi | H01L 27/3276 |

FOREIGN PATENT DOCUMENTS

| | | |
|---|---|---|
| JP | H09-148066 A | 6/1997 |
| KR | 10-2009-0122870 A | 12/2009 |

* cited by examiner

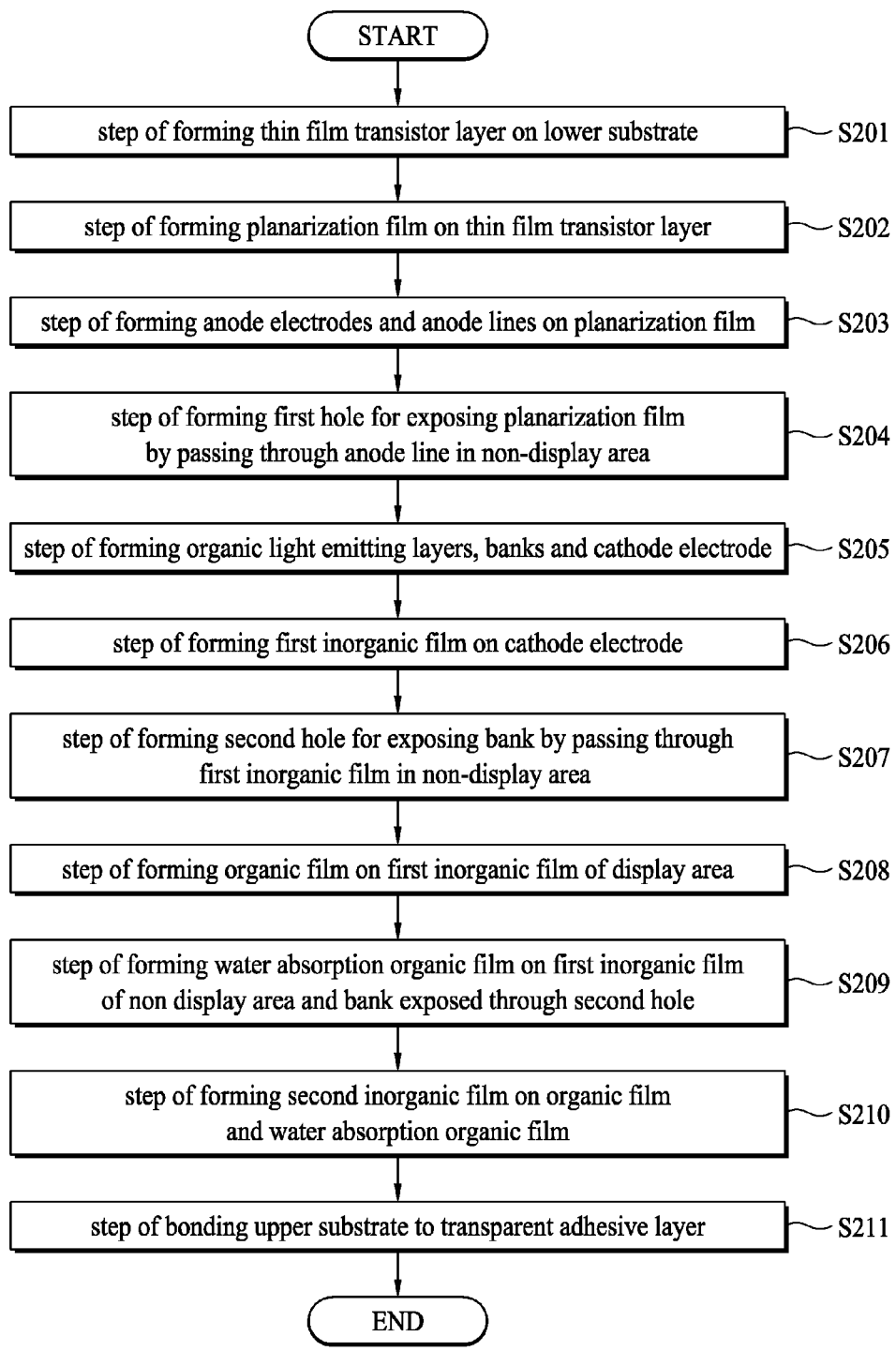

ORGANIC LIGHT EMITTING DISPLAY DEVICE AND FABRICATING METHOD THEREOF

CROSS REFERENCE TO RELATED APPLICATIONS

This application claims the benefit of the Korean Patent Application No. 10-2014-0154512 filed on Nov. 7, 2014, which is hereby incorporated by reference for all purposes as if fully set forth herein.

BACKGROUND OF THE INVENTION

Field of the Invention

The present invention relates to an organic light emitting display device and a fabricating method thereof.

Discussion of the Related Art

With the advancement of information society, a demand for a display device for displaying an image has increased in various forms. Recently, various flat panel display devices such as a liquid crystal display (LCD), a plasma display panel (PDP), and an organic light emitting display device have been used.

Of the display devices, the organic light emitting display device which is a self light emitting display device is more excellent for a viewing angle, a contrast ratio, etc. than the LCD, and may be fabricated at a lightweight and slim size and is favorable in view of power consumption as it does not need a separate backlight. Also, the organic light emitting display device is favorable in view of direct current low voltage driving, a fast response speed, and especially a low fabricating cost.

The organic light emitting display device is fabricated by several processes including, e.g., forming a thin film transistor layer on a substrate, forming a planarization film for planarization on the thin film transistor layer, forming an organic light emitting diode layer, which includes an organic light emitting diode, on the planarization film, wherein the organic light emitting diode includes an anode electrode, an organic light emitting layer and a cathode electrode. An encapsulation layer, which includes multilayered organic and inorganic films, is formed on the organic light emitting diode layer to protect the organic light emitting diode and the cathode electrode from oxygen and water.

The planarization film may be formed of a resin such as photo acryl and polyimide. If the planarization film is exposed to the atmosphere, since the planarization film absorbs water, water inside a vacuum deposition equipment is removed before the substrate provided with the thin film transistor layer is loaded into the vacuum deposition equipment during a process of depositing the planarization film. However, in spite of this effort, water may remain in the planarization film. For example, if water of a minute amount of 150 ppm exists in the planarization film, the organic light emitting diode or the cathode electrode may be damaged by outgassing generated in the planarization film. In this case, a problem may occur in that a pixel of the organic light emitting diode or the cathode electrode damaged due to water is displayed as a black spot.

SUMMARY OF THE INVENTION

Accordingly, the present invention is directed to an organic light emitting display device and a fabricating method thereof, which substantially obviate one or more problems due to limitations and disadvantages of the related art.

An object of the present invention is to provide an organic light emitting display device and a fabricating method thereof, in which an organic light emitting diode or a cathode electrode may be prevented from being damaged by outgassing generated due to water remaining in a planarization film.

Additional advantages and features of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device according to various embodiments of the present invention comprises: a substrate; a thin film transistor layer provided on the substrate; a planarization film provided on the thin film transistor layer to planarize the thin film transistor layer; an anode line provided on the planarization film that exposes a portion of the planarization film in a non-display area of the display device corresponding to a periphery area outside a display area of the display device; and a water absorption organic film provided on the portion of the planarization film exposed by the anode line, and comprising an organic material that is configured to at least partially absorb outgassing from the planarization film.

In one or more embodiments, the organic light emitting display device further comprises: a bank disposed on the portion of the planarization film exposed by the anode line, wherein the bank comprises a hole that exposes a sub-portion of the portion of the planarization film exposed by the anode line, and wherein the water absorption organic film fills the hole so as to contact said sub-portion. For example, the water absorption organic film may be in direct mechanical contact with the planarization film via the hole in the bank.

In one or more embodiments, the organic light emitting display device further comprises: a bank disposed on the portion of the planarization film exposed by the anode line; an inorganic film provided on the bank that exposes a portion of the bank in the non-display area, wherein the water absorption organic film is provided on the portion of the bank exposed by the inorganic film. The water absorption organic film may be in direct mechanical contact with the portion of the bank exposed by the inorganic film.

In one or more embodiments, the portion of the bank exposed by the inorganic film at least partially overlaps the portion of the planarization layer exposed by the anode line.

In one or more embodiments, the anode line comprises a first hole for exposing the portion of the planarization film in the non-display area, wherein the first hole is filled by the bank. The bank may be in direct physical contact with the portion of the planarization film exposed by the first hole.

In one or more embodiments, the inorganic film comprises a second hole for exposing the portion of the bank in the non-display area, wherein the second hole is filled by the water absorption organic film. The water absorption organic film may be in direct physical contact with the portion of the bank exposed by the second hole.

In one or more embodiments, the water absorption organic film is in direct mechanical contact with the portion of the planarization film exposed by the anode line.

In one or more embodiments, the water absorption organic film includes an epoxy resin and an organometallic complex, wherein a ratio between the epoxy resin and the organometallic complex is 9:1.

In one or more embodiments, the water absorption organic film is provided in the display area and the non-display area.

In one or more embodiments, the water absorption organic film is provided in the non-display area only. The organic light emitting display device may further comprise a transparent organic film provided in the display area adjacent to the water absorption organic film. The water absorption organic film may have a water absorption capability that is higher than that of the transparent organic film. The transparent organic film may comprise at least one of epoxy, acrylate, urethaneacrylate, polyurea, polyacrylate, perylenetetracarboxylic dianhydride (PTCDA), biphenyl-tetracarboxylic acid dianhydride (BPDA) or pyromellitic dianhydride (PMDA).

In another aspect, a method of fabricating an organic light emitting display device comprises: forming a thin film transistor layer on a substrate; forming a planarization film on the thin film transistor layer for planarizing the thin film transistor layer; forming an anode line on the planarization film that exposes a portion of the planarization film in a non-display area of the display device corresponding to a periphery area outside a display area of the display device; and forming a water absorption organic film on the portion of the planarization film exposed by the anode line, wherein the water absorption organic film comprises an organic material that is configured to at least partially absorb outgassing from the planarization film.

In one or more embodiments, the method further comprises: forming a bank on the portion of the planarization film exposed by the anode line; and forming an inorganic film on the bank that exposes a portion of the bank in the non-display area; wherein the water absorption organic film is formed on the portion of the bank exposed by the inorganic film. Forming the anode line on the planarization film may include forming a first hole in the anode line for exposing the portion of the planarization film in the non-display area after forming the anode line on the planarization film, and forming the bank on the portion of the planarization film exposed by the anode line may include filling the first hole with the bank. Forming the inorganic film on the bank may include forming a second hole in the bank for exposing the portion of the bank in the non-display area after forming the inorganic film on the bank, and forming the water absorption organic film on the portion of the bank exposed by the inorganic film may include filling the second hole with the water absorption organic film.

In one or more embodiments, the method further comprises forming the water absorption organic film in the display area and the non-display area.

In one or more embodiments, the method further comprises: forming the water absorption organic film in the non-display area only. In this case, the method may further comprise forming a transparent organic film in the display area adjacent to the water absorption organic film. The water absorption organic film may have a water absorption capability that is higher than that of the transparent organic film.

In one or more embodiments, the water absorption organic film includes an epoxy resin and an organometallic complex. A ratio between the epoxy resin and the organometallic complex may be 9:1.

In accordance with another aspect of the present invention, an organic light emitting display device may include: a lower substrate; a thin film transistor layer provided on the lower substrate; a planarization film provided on the thin film transistor layer to planarize the thin film transistor layer; an anode line provided on the planarization film to partially expose the planarization film in a non-display area corresponding to a periphery area of a display area; a bank provided on the planarization film which is partially exposed; a first inorganic film provided on the bank to partially expose the bank; and a water absorption organic film provided on the bank which is partially exposed.

The water absorption organic film may include an organic material having water absorption for absorbing outgas generated by the planarization film.

The water absorption organic film may include an epoxy resin and an organometallic complex.

A first hole for exposing the planarization film by partially passing through the anode line may be provided in the non-display area, and the bank may be provided on the planarization film exposed by the first hole.

A second hole for exposing the bank by partially passing through the first inorganic film may be provided in the non-display area, and the water absorption organic film may be provided on the bank exposed by the second hole.

The water absorption organic film may be provided in the display area and the non-display area.

The water absorption organic film may be provided in the non-display area only.

The organic light emitting display device may further comprise a transparent organic film provided on the first inorganic film in the display area.

In another aspect, a method of fabricating an organic light emitting display device may comprise the steps of forming a thin film transistor layer on a lower substrate; forming a planarization film for planarizing the thin film transistor layer on the thin film transistor layer; forming an anode line on the planarization film to partially expose the planarization film in a non-display area corresponding to a periphery area of a display area; forming a bank on the planarization film which is partially exposed; forming a first inorganic film on the bank to partially expose the bank; and forming a water absorption organic film on the bank which is partially exposed.

The water absorption organic film may include an organic material having water absorption for absorbing outgas generated by the planarization film.

The water absorption organic film may include and epoxy resin and an organometallic complex.

The step of forming an anode line on the planarization film may include forming a first hole for exposing the planarization film by partially passing through the anode line after forming the anode line on the planarization film, and the step of forming a bank on the planarization film which is partially exposed may include forming the bank on the planarization film exposed by the first hole.

The step of forming a first inorganic film on the bank may include forming a second hole for exposing the bank by partially passing through the first inorganic film after forming the first inorganic film on the bank, and the step of forming a water absorption organic film on the bank which is partially exposed may include forming the water absorption organic film on the bank exposed by the second hole.

The step of forming a water absorption organic film on the bank which is partially exposed may include forming the water absorption organic film in the display area and the non-display area.

The step of forming a water absorption organic film on the bank which is partially exposed may include forming the water absorption organic film in the non-display area only.

The method may further comprise the step of forming a transparent organic film on the first inorganic film in the display area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 7 is a flow chart illustrating a method of fabricating an organic light emitting display device according to another example embodiment of the present invention.

DETAILED DESCRIPTION OF THE ILLUSTRATED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts. In the following description of the present invention, if detailed description of elements or functions known in respect of the present invention is determined to make the subject matter of the present invention unnecessarily obscure, the detailed description will be omitted. Also, titles of elements used in the following description may be selected considering easiness of drafting of the specification, and may be different from those of parts of the actual product.

Figure 1:
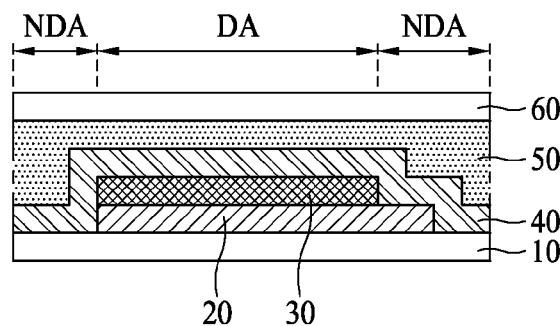
FIG. 1 is an exemplary view briefly illustrating an organic light emitting display device according to an example embodiment of the present invention.

FIG. 1 is an exemplary view briefly illustrating an organic light emitting display device according to an example embodiment of the present invention. In FIG. 1, one side sectional-view of an organic light emitting display device according to the embodiment of the present invention is shown for convenience of description. Referring to FIG. 1, the organic light emitting display device according to the embodiment of the present invention includes a lower substrate 10, a thin film transistor layer 20, an organic light emitting diode layer 30, an encapsulation layer 40, an adhesive layer 50, and an upper substrate 60.

The lower substrate 10 may be formed of glass or plastic. If the organic light emitting display device according to the embodiment of the present invention is realized as a flexible display device, the lower substrate 10 may be bendable, and may be formed of a material having a high restoring force.

Figure 2:
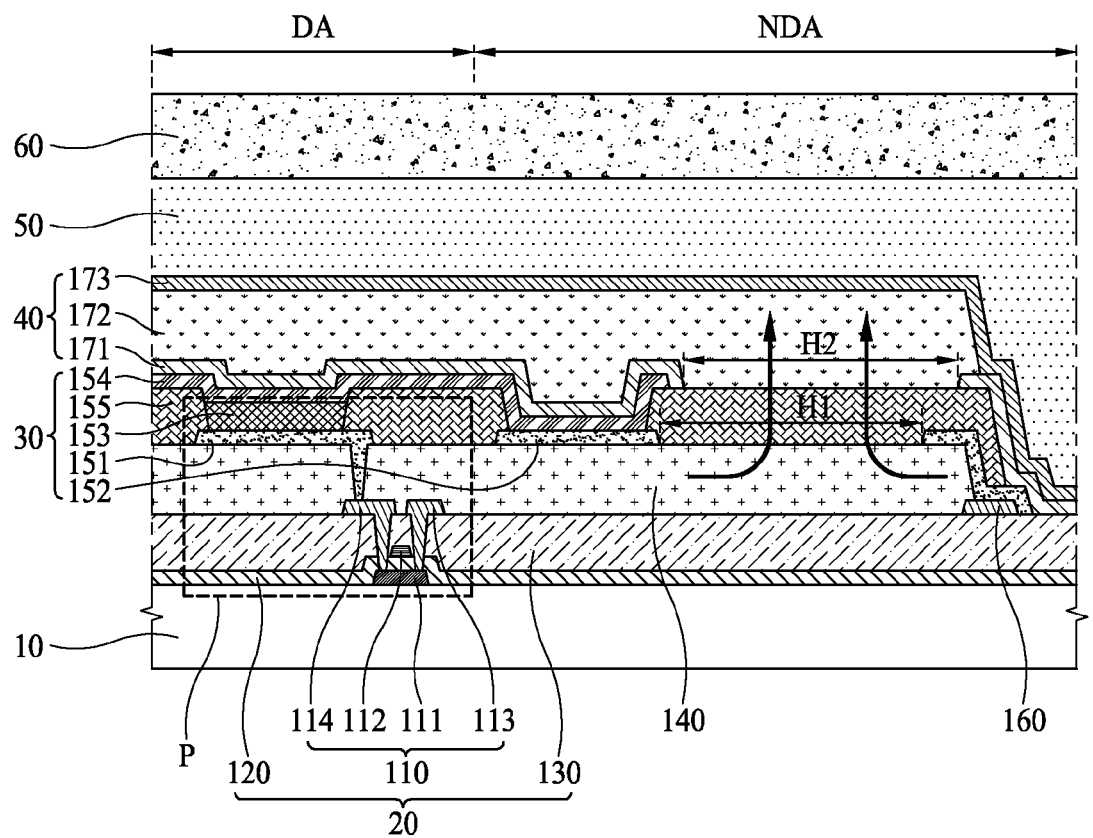
FIG. 2 is a cross-sectional view illustrating an organic light emitting display device according to one example embodiment of the present invention.
Figure 6:
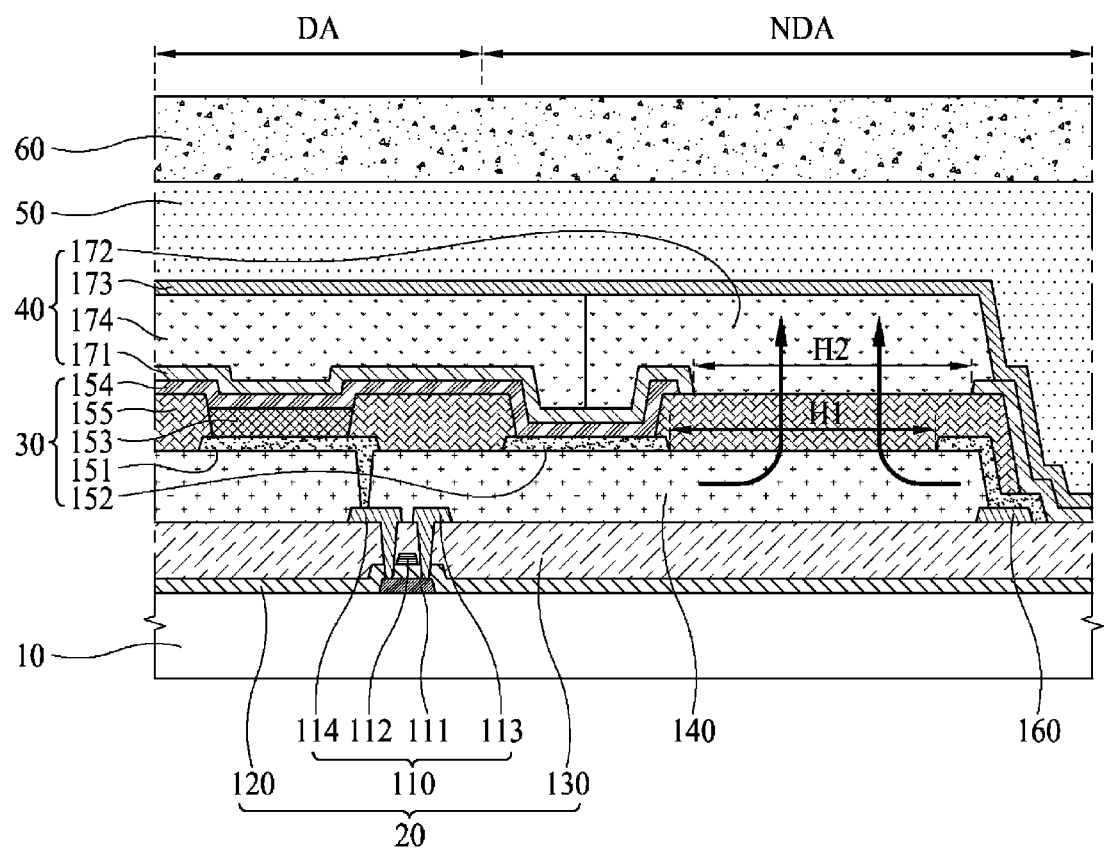
FIG. 6 is a cross-sectional view illustrating an organic light emitting display device according to another example embodiment of the present invention.

The thin film transistor layer 20 is provided on the lower substrate 10. The thin film transistor layer 20 includes gate lines, data lines, and thin film transistors. Each of the thin film transistors includes a gate electrode, a semiconductor layer, and source and drain electrodes as shown in FIGS. 2 and 6. If a gate driving circuit is formed in a gate driver in panel (GIP) type, the thin film transistor layer 20 may be provided in a display area (DA) and a non-display area (NDA) as shown in FIG. 1. Alternatively, if the gate driving circuit is packaged in a tape carrier package (TCP) and the gate TCP is attached to the non-display area (NDA), the thin film transistor layer 20 may be provided in the display area (DA) only.

Figure 3:
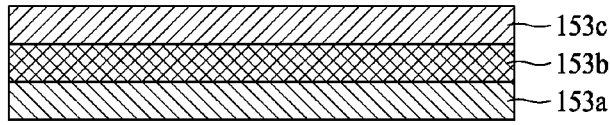
FIG. 3 is an exemplary detailed view illustrating an organic light emitting layer of FIG. 2.

The organic light emitting diode layer 30 is provided on the thin film transistor layer 20. The organic light emitting diode layer 30 includes anode electrodes, anode lines, organic light emitting layers, a cathode electrode, and banks as shown in FIGS. 2 and 6. Each of the organic light emitting layers may include a hole transporting layer, a light emitting layer, and an electron transporting layer as shown in FIG. 3. In this case, if a voltage is applied to each of the anode electrode and the cathode electrode, holes and electrons are moved to the light emitting layer through the hole transporting layer and the electron transporting layer, respectively, and are combined with each other in the light emitting layer to emit light. In FIG. 1, the area where the organic light emitting diode layer 30 is provided is defined as the display area (DA), and a periphery area outside the display area (DA) (e.g., a remaining area excluding the display area) is defined as the non-display area (NDA).

The encapsulation layer 40 is provided on the organic light emitting diode layer 30. The encapsulation layer 40 serves to prevent oxygen or water from being permeated into the organic light emitting diode layer 30. The encapsulation layer 40 includes at least one organic film and at least one inorganic film. For example, the encapsulation layer 40 may include a first inorganic film, a water absorption organic film, and a second inorganic film as shown in FIGS. 2 and 6. The water absorption organic film may include an organic material having water absorption (in other words, an organic material that absorbs water).

The adhesive layer 50 is a transparent adhesive layer 50 that is provided on the encapsulation layer 40. The transparent adhesive layer 50 bonds the lower substrate 10 provided with the thin film transistor layer 20, the organic light emitting diode layer 30 and the encapsulation layer 40 to the upper substrate 60. The transparent adhesive layer 50 may be an optically clear resin (OCR) layer or an optically clear adhesive (OCA) film. If the transparent adhesive layer 50 is an OCA film, a predetermined planarization layer may be additionally provided on the encapsulation layer 40 to bond the upper substrate 60 to the lower substrate 10 more rigidly and then bonded to the upper substrate 60. That is, in this case the adhesive layer 50 (OCA film) may be disposed between the planarization layer and the upper substrate 60.

The upper substrate 60 serves as a cover substrate or cover window, which covers the lower substrate 10. The upper substrate 60 may be formed of glass or plastic.

FIG. 2 is a cross-sectional view illustrating an organic light emitting display device according to one example embodiment of the present invention. The display area DA and the non-display area NDA are partially shown in FIG. 2.

Referring to FIG. 2, the thin film transistor layer 20 is provided on the lower substrate 10. The thin film transistor layer 20 includes gate lines (not shown), data lines (not shown), thin film transistors 110, a gate insulating film 120, and an interlayer insulating film 130. Although FIG. 2 illustrates that the thin film transistors 110 are formed in a top gate type in which a gate electrode is arranged on a semiconductor layer, it is to be understood that the present invention is not limited to the example of FIG. 2. That is, the thin film transistors 110 may be formed in a bottom gate type in which a gate electrode is arranged below a semiconductor layer. Each of the thin film transistors 110 includes a semiconductor layer 111, a gate electrode 112, a source electrode 113 and a drain electrode 114 as shown in FIG. 2.

The semiconductor layers 111 are provided on the lower substrate 10. A buffer film (not shown) may be provided between the lower substrate 10 and the semiconductor layers 111. The gate insulating film 120 may be provided on the semiconductor layers 111. The gate electrodes 112 may be provided on the gate insulating film 120. The interlayer insulating film 130 may be provided on the gate electrodes 112. The source electrodes 113 and the drain electrodes 114 may be provided on the interlayer insulating film 130. Each of the source electrodes 113 and the drain electrodes 114 may be connected to the semiconductor layer 111 through a contact hole that passes through the interlayer insulating film 130 and the gate insulating film 120.

The planarization film 140 is provided on the thin film transistor layer 20. In more detail, if the organic light emitting display device is formed in a top emission type, the planarization film 140 is provided on the thin film transistor layer 20 to arrange pixels P partitioned by banks 155 with planarization.

The planarization film 140 may be formed of a resin such as photo acryl and polyimide. In this case, if the planarization film 140 is exposed to the atmosphere, since the planarization film 140 absorbs water, water inside a vacuum deposition equipment is removed before the substrate is loaded into the vacuum deposition equipment to deposit the planarization film 140 on the thin film transistor layer 20.

The organic light emitting diode layer 30 is provided on the planarization film 140. The organic light emitting diode layer 30 includes anode electrodes 151, an anode line 152, organic light emitting layers 153, a cathode electrode 154, and banks 155. The anode electrodes 151 and the organic light emitting layers 153 may be provided in the display area DA, and the anode line 152, the cathode electrode 154 and the banks 155 may be provided in the display area DA and the non-display area NDA.

The anode electrodes 151 are provided on the planarization film 140. Each of the anode electrodes 151 is connected to the drain electrode 114 through a contact hole that passes through the planarization film 140.

Also, the anode line 152 is provided on the planarization film 140. The anode line 152 may be a power line for supplying a power voltage or a driving voltage line for supplying a driving voltage supplied to the gate driving circuit. For example, the anode line 152 may be a cathode power line connected to a source drain pattern 160 and the cathode electrode 154 to supply a cathode power source as shown in FIG. 2. The source drain pattern 160 is exposed to the outside of the planarization film 140, and the power voltage or the driving voltage may be supplied to the source drain pattern 160.

The organic light emitting layers 153 are provided on the anode electrodes 151 exposed between the banks 155 (in other words, not covered by the banks 155) in the display area DA. Since each of the banks 155 is higher than each of the organic light emitting layers 153, the organic light emitting layers 153 are partitioned by the banks 155. That is, each of the organic light emitting layers 153 is arranged between the banks 155. Meanwhile, an area that includes the anode electrode 151 exposed between the banks 155, the organic light emitting layer 153 provided on the anode electrode 151 and the thin film transistor 110 of which the drain electrode 114 is connected to the anode electrode 151 may be defined as a pixel P as shown in FIG. 2.

Each of the organic light emitting layers 153 may include a hole transporting layer 153a, a light emitting layer 153b, and an electron transporting layer 153c as shown in FIG. 3. In this case, if a voltage is applied to the anode electrode 151 and the cathode electrode 154, holes and electrons are moved to the light emitting layer 153b through the hole transporting layer 153a and the electron transporting layer 153c, respectively and combined with each other in the light emitting layer 153b to emit light.

The cathode electrode 154 is provided on the organic light emitting layers 153 and the banks 155 in the display area DA to cover the organic light emitting layers 153 and the banks 155. The cathode electrode 154 may be provided on the anode line 152 exposed between the banks 155 in the non-display area NDA.

Meanwhile, the anode line 152 is configured to partially expose the planarization film in the non-display area NDA, and the bank 155 is provided on the planarization film which is partially exposed. In other words, the bank 155 may be formed on an exposed portion of the planarization film 140. In still other words, the bank 155 may be formed on a portion of the planarization film 140 that is not covered by the anode line 152. Since the anode line 152 of the non-display area NDA is a line for connecting a predetermined line, e.g. the source drain pattern 160, with the cathode electrode 154, the anode line 152 should be provided on the planarization film 140 as shown in FIG. 5C. However, in an example embodiment of the present invention, to provide a path for outgassing of the planarization film 140, a first hole H1 for exposing the planarization film 140 by partially passing through the anode line 152 is provided. As a result, the bank 155 may be provided on the planarization film 140 exposed by the first hole H1. In other words, a first hole H1 may be formed within the anode line 152 that exposes the planarization film 140, and the bank 155 may be formed on the portion of the planarization film 140 that is exposed by the first hole H1. For example, the planarization film 140 may fill the first hole H1.

The encapsulation layer 40 is provided on the organic light emitting diode layer 30. The encapsulation layer 40 serves to prevent oxygen or water from being permeated into the organic light emitting diode layer 30. To this end, the encapsulation layer 40 may include a first inorganic film 171, a water absorption organic film 172, and a second inorganic film 173.

The first inorganic film 171 is provided on the cathode electrode 154 to cover the cathode electrode 154. The water absorption organic film 172 is provided on the first inorganic film 171 to prevent particles from being permeated into the organic light emitting layer 153 and the cathode electrode 154 by passing through the first inorganic film 171. The second inorganic film 173 is provided on the water absorption organic film 172 to cover the water absorption organic film 172.

Each of the first and second inorganic films 171 and 172 may be formed of a nitride material or an oxide material, e.g. silicon nitride, aluminum nitride, zirconium nitride, titanium nitride, hafnium nitride, tantalum nitride, silicon oxide, aluminum oxide or titanium oxide. For example, each of the first and second inorganic films 171 and 172 may be formed of any one of $SiO_2$, $Al_2O_3$, SiON, and SiNx.

If the water absorption film 172 is provided in the display area DA and the non-display area NDA, the water absorption film 172 may be formed of a transparent and water-absorptive organic film to pass through light emitted from the organic light emitting layers 153 of the display area DA. For example, the water absorption organic film 172 may include an epoxy resin and an organometallic complex. A ratio of the epoxy resin to the organometallic complex, which are included in the water absorption organic film 172, may be, but not limited to, 9:1. The ratio of the epoxy resin to the organometallic complex is a weight percent (wt %) ratio. That is, the ratio of the epoxy resin to the organometallic complex, which are included in the water absorption organic film 172, may be modified by the person skilled in the art within the range of design that may be modified.

Meanwhile, the first inorganic film 171 is configured to partially expose the bank 155 provided on the planarization film 140 exposed by the first hole H1 in the non-display area NDA, and the water absorption organic film 172 may be provided on the bank 155 which is partially exposed. In other words, the water absorption organic film 172 may be formed on a portion of the bank 155 that is not covered by the first inorganic film 172. Since the first inorganic film 171 is a film for protecting the organic light emitting layer 153 and the cathode electrode 154 from oxygen and water, the first inorganic film 171 should be provided as shown in FIG. 5H to cover the bank 155 in the non-display area NDA. However, in an example embodiment of the present invention, to provide a path for outgassing of the planarization film 140, a second hole H2 for exposing the bank 155 by partially passing through the first inorganic film 171 is provided in the non display area NDA. As a result, the water absorption organic film 172 may be provided on the bank 155 exposed by the second hole H2 of the non-display area NDA. In other words, a second hole H2 may be formed within the first inorganic film 172 that exposes the bank 155, and the water absorption organic film 172 may be formed on the portion of the bank 155 that is exposed by the second hole H2. For example, the water absorption film 172 may fill the second hole H2.

The transparent adhesive layer 50 is provided on the encapsulation layer 40. The transparent adhesive layer 50 bonds the lower substrate 10 provided with the thin film transistor layer 20, the organic light emitting diode layer 30 and the encapsulation layer 40 to the upper substrate 60.

As described above, according to an example embodiment of the present invention, the anode line 152 is provided in the non-display area NDA to partially expose the planarization film 140, the first inorganic film 171 is provided to partially expose the bank 155 provided on the planarization film 140 which is partially exposed, and the water absorption organic film 172 is provided on the bank 155 which is partially exposed. As a result, in an example embodiment of the present invention, a path may be provided as shown by arrows in FIG. 2, through which outgassing generated by the planarization film 140 may be transferred to the water absorption organic film 172, such that the outgassing may be absorbed by the water absorption organic film 172 if water remains in the planarization film 140. Therefore, in an example embodiment of the present invention, the organic light emitting diode or the cathode electrode may be prevented from being damaged by outgassing generated by water remaining in the planarization film.

In the example embodiment shown in FIG. 2, the bank 155 is disposed between the planarization film 140 and the water absorption organic film 172. However, it is to be understood that in accordance with one or more embodiments, the bank 155 may not need to be disposed between the planarization film 140 and the water absorption organic film 172. For example, one or more other layers may be disposed between the planarization film 140 and the water absorption organic film 172 instead of the bank 155, for example as long as the water absorption organic film 172 can at least partially absorb outgassing generated in the planarization film 140.

Also, in one or more embodiments, one or more other layers may be disposed between the planarization film 140 and the water absorption organic film 172 in addition to the bank 155. Also, in one or more embodiments, the bank 155 may have an opening (hole), and the water absorption organic film 172 may fill the opening so as to contact the planarization film 140. The opening (hole) may expose a sub-portion of the portion of the planarization film exposed by the anode line 152, and wherein the water absorption organic film fills the hole so as to contact said sub-portion. For example, the water absorption organic film may be in direct mechanical contact with the planarization film 140 via the hole in the bank 155.

Also, in one or more embodiments, the bank 155 may be omitted, and the water absorption organic film 172 may be in direct mechanical contact with the planarization film 140.

Illustratively, in accordance with various embodiments, the water absorption organic film 172 may be provided as a moisture-absorbing layer above the planarization film 140 and may be configured to at least partially absorb moisture created by the planarization film 140. To this end, the layer arrangement including the planarization film 140 and the water absorption organic film 172 (and possibly, one or more other layers such as, e.g., the bank 155, the first inorganic film 171, or others) may be configured such that a moisture-carrying path is provided leading from the planarization film 140 (i.e., the moisture-creating film) to the water absorption organic film 172 (i.e., the moisture-absorbing film).

Figure 4:
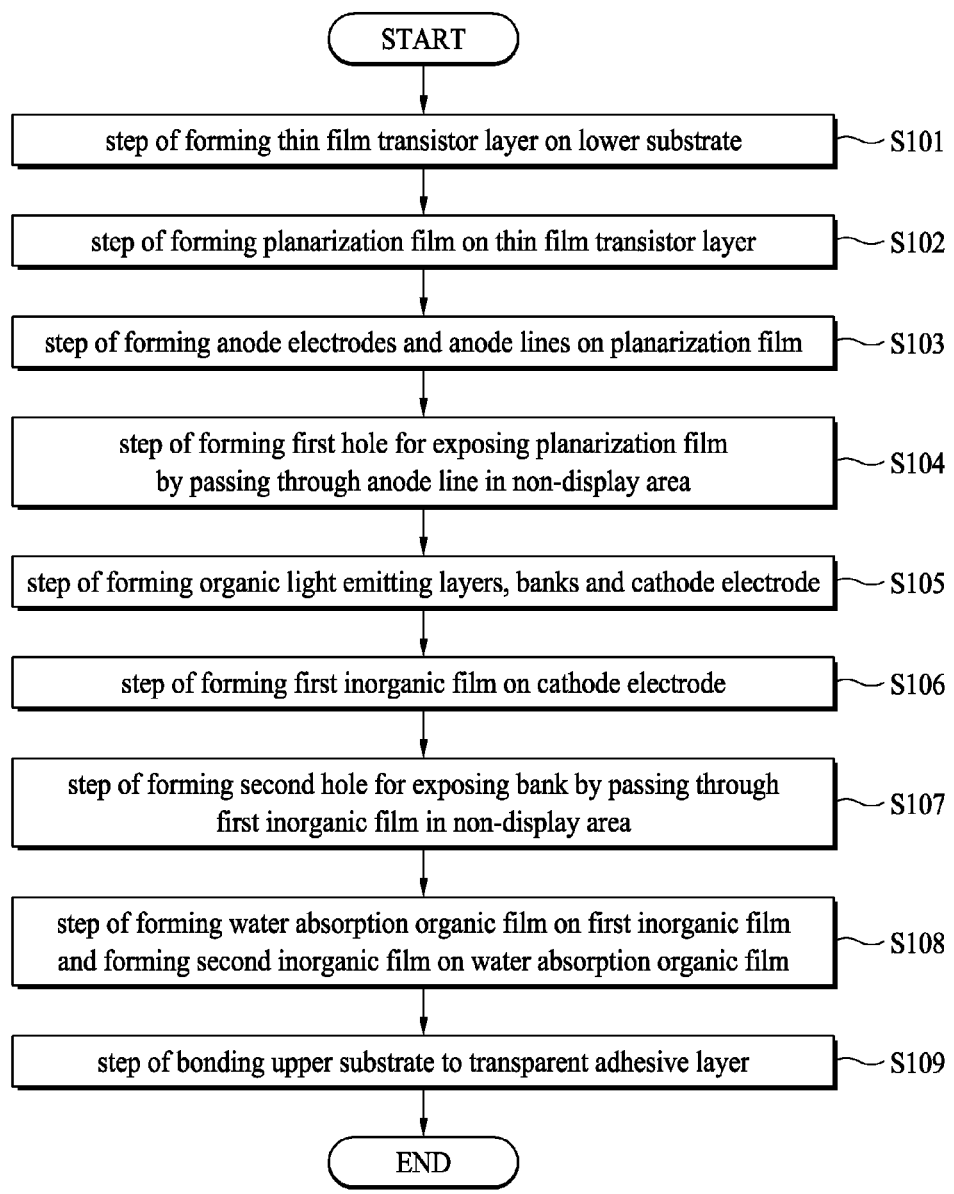
FIG. 4 is a flow chart illustrating a method of fabricating an organic light emitting display device according to an example embodiment of the present invention.

FIG. 4 is a flow chart illustrating a method of fabricating an organic light emitting display device according to one example embodiment of the present invention. FIGS. 5A to 5I are cross-sectional views illustrating a method of fabricating an organic light emitting display device according to an example embodiment of the present invention. Hereinafter, the method of fabricating an organic light emitting display device according to an example embodiment of the present invention will be described in detail with reference to FIGS. 5A to 5I.

Figure 5A:
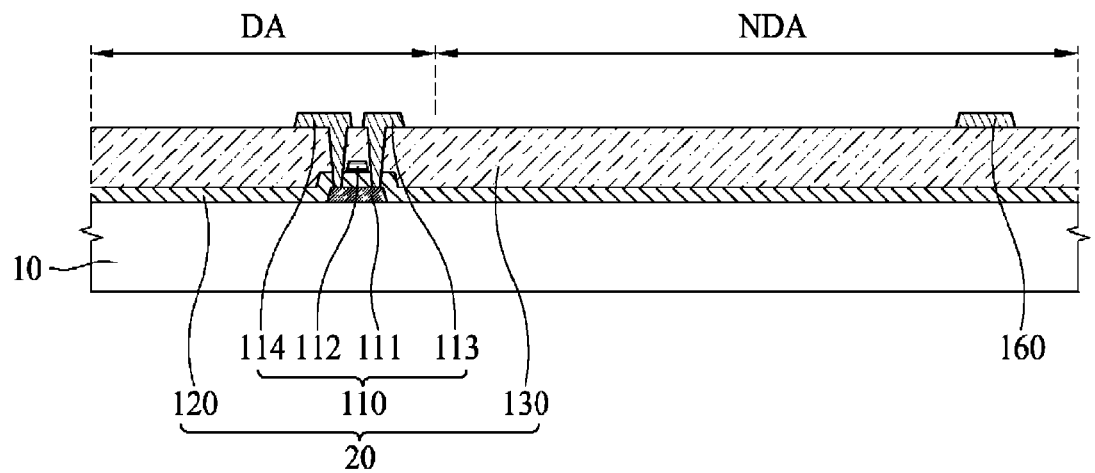
FIGS. 5A to 5I are cross-sectional views illustrating a method of fabricating an organic light emitting display device according to an example embodiment of the present invention.

First of all, the thin film transistor layer 20 is formed on the lower substrate 10 as shown in FIG. 5A. The lower substrate 10 may be formed of glass or plastic. The thin film transistor layer 20 includes gate lines (not shown), data lines (not shown), thin film transistors 110, a gate insulating film 120, and an interlayer insulating film 130. Although FIG. 5A illustrates that the thin film transistors 110 are formed in a top gate type in which a gate electrode 112 is arranged on a semiconductor layer 111, it is to be understood that the present invention is not limited to the example of FIG. 5A.

That is, the thin film transistors 110 may be formed in a bottom gate type in which a gate electrode is arranged below a semiconductor layer. The thin film transistors 110 are formed in the display area DA.

The semiconductor layers 111 are formed on the lower substrate 10. Alternatively, after a buffer film (not shown) is formed on the lower substrate 10, the semiconductor layers 111 may be formed on the buffer film. The gate insulating film 120 is formed on the semiconductor layers 111. The gate insulating film 120 is to insulate the semiconductor layers 111 from other conductive materials (e.g., metals). In particular, the gate insulating film 120 is to insulate the semiconductor layers 111 from the gate electrodes 112 (e.g., metal gates). The gate electrodes 112 are formed on the gate insulating film 120. The interlayer insulating film 130 is formed on the gate electrodes 112. The source electrodes 113 and the drain electrodes 114 are formed on the interlayer insulating film 130. Before the source electrodes 113 and the drain electrodes 114 are formed, contact holes for exposing the semiconductor layers 111 by passing through the gate insulating film 120 and the interlayer insulating film 130 may be formed. For this reason, each of the source electrodes 113 and the drain electrodes 114 may be connected to the semiconductor layer 111 through the contact hole that passes through the gate insulating film 120 and the interlayer insulating film 130 (S101 of FIG. 4).

Figure 5B:
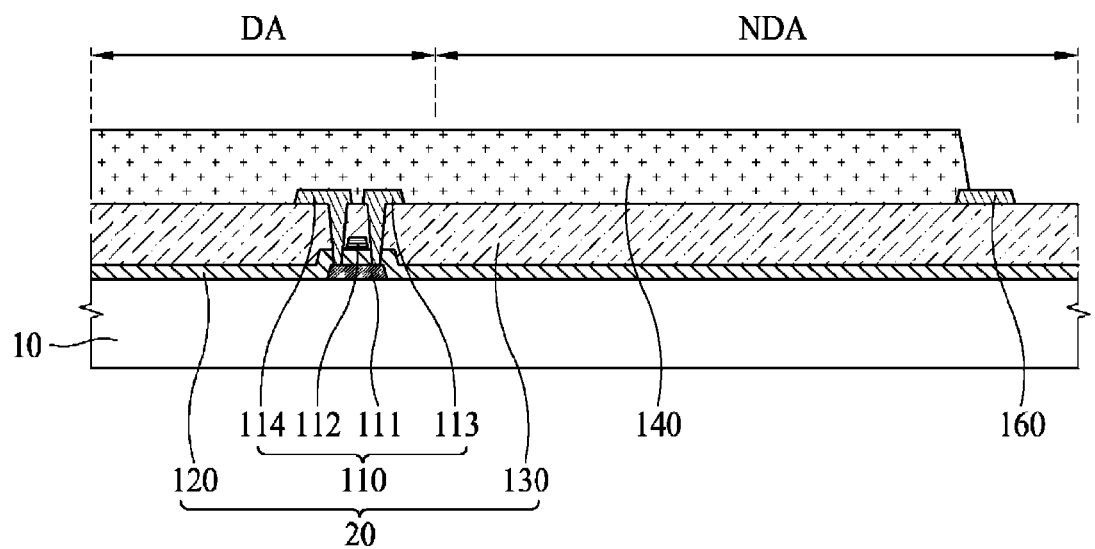
Figure 5C:
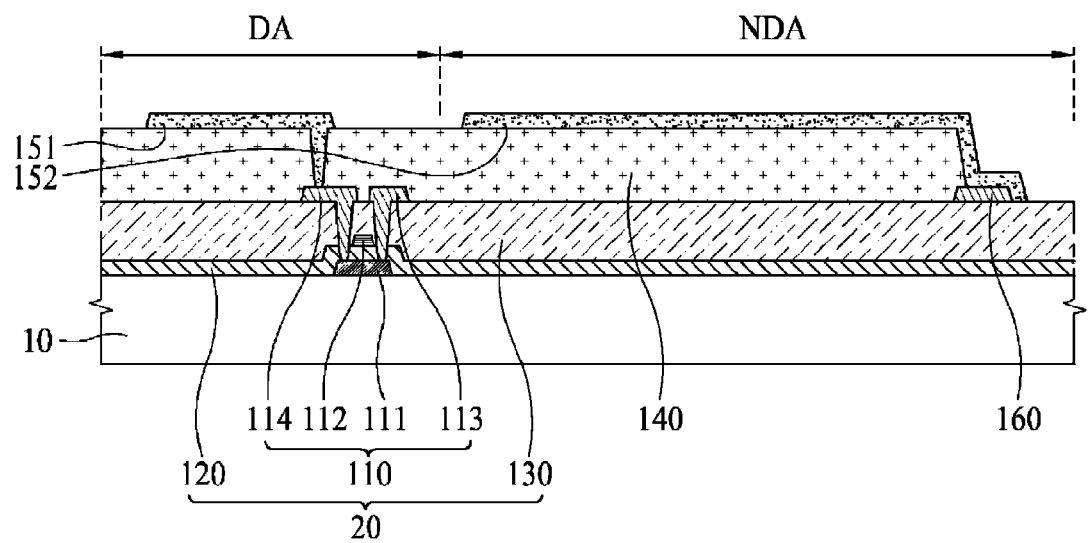

Second, as shown in FIG. 5B, the planarization film 140 is formed on the thin film transistor layer 20. If the organic light emitting display device is formed in a top emission type, the planarization film 140 is to arrange pixels P partitioned by the banks 155 with planarization. The planarization film 140 may be formed of a resin such as photo acryl and polyimide. In this case, if the planarization film 140 is exposed to the atmosphere, since the planarization film 140 absorbs water, water inside a vacuum deposition equipment may be removed before the substrate is loaded into the vacuum deposition equipment to deposit the planarization film 140 on the thin film transistor layer 20 (S102 of FIG. 4).

Third, as shown in FIG. 5C, the anode electrodes 151 and the anode line 152 are formed on the planarization film 140. Before the anode electrodes 151 are formed, contact holes for exposing the drain electrodes 114 by passing through the planarization film 140 may be formed. For this reason, each of the anode electrodes 151 may be connected to the drain electrode 114 through the contact hole for passing through the planarization film 140.

The anode line 152 may be a power line for supplying a power voltage or a driving voltage line for supplying a driving voltage supplied to the gate driving circuit. For example, if the power voltage or the driving voltage is supplied to the source drain pattern 160 in FIG. 5C, the anode line 152 may be connected to a predetermined source drain pattern 160 exposed to the outside of the planarization film 140.

Figure 5D:
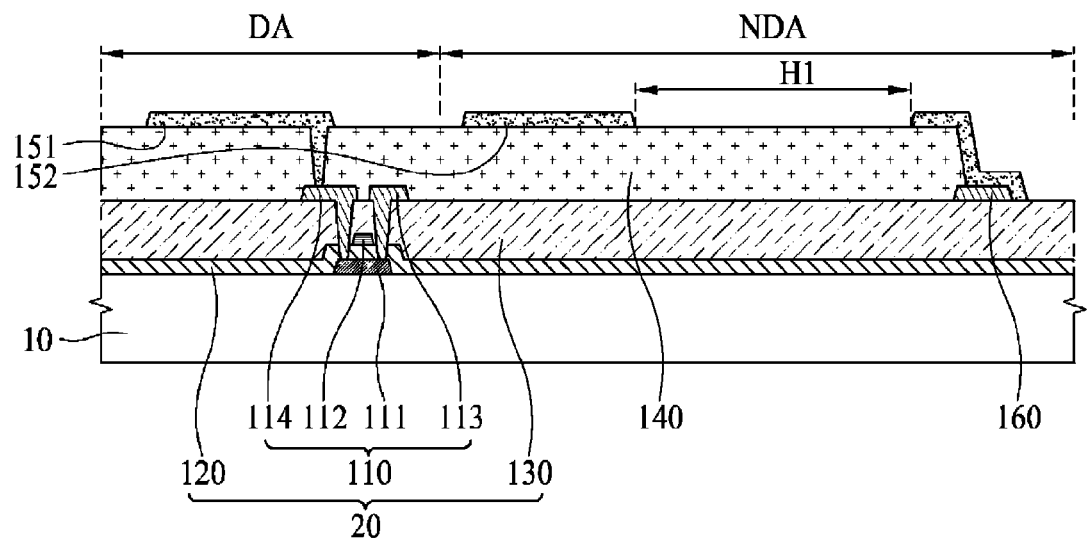

Meanwhile, the anode line 152 provided in the non-display area NDA may be formed to partially expose the planarization film 140 as shown in FIG. 5D. In more detail, the first hole H1 that passes through the anode line 152 provided in the non-display area NDA is formed. For this reason, the planarization film 140 is exposed through the first hole H1 (S103 and S104 of FIG. 4).

Figure 5E:
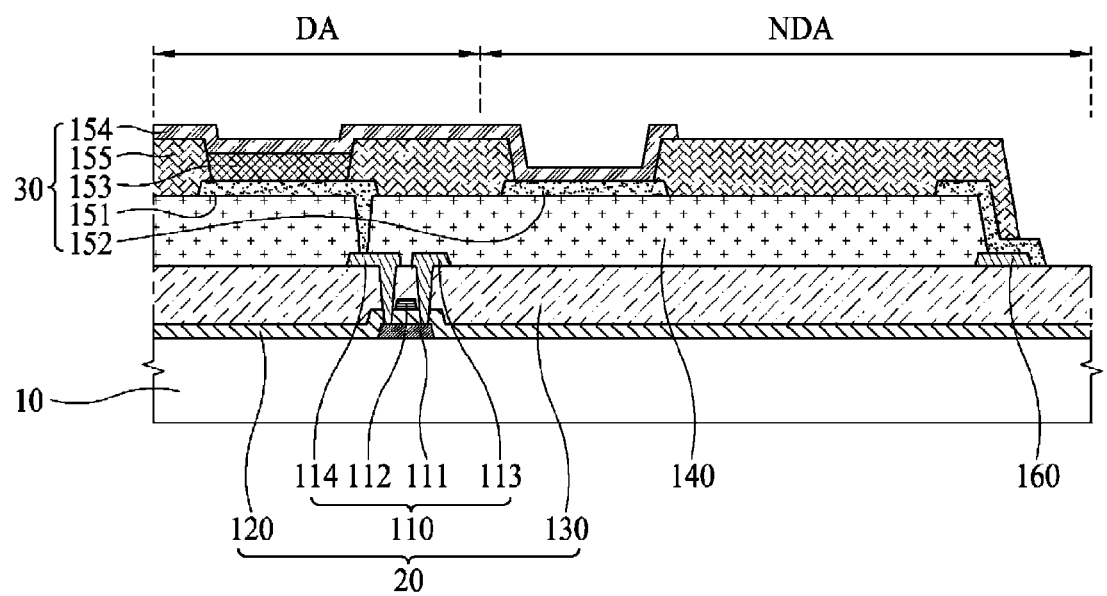

Fourth, as shown in FIG. 5E, the organic light emitting layers 153, the cathode electrode 154 and the banks 155 are formed. The organic light emitting layers 153 are formed on the anode electrode 151 exposed between the banks 155 in the display area DA. The cathode electrode 154 is formed on the organic light emitting layers 153 and the banks 155 in the display area DA to cover the organic light emitting layers 153 and the banks 155. The cathode electrode 154 may be formed on the anode line 152 exposed between the banks 155 in the non-display area NDA (S105 of FIG. 4).

Figure 5F:
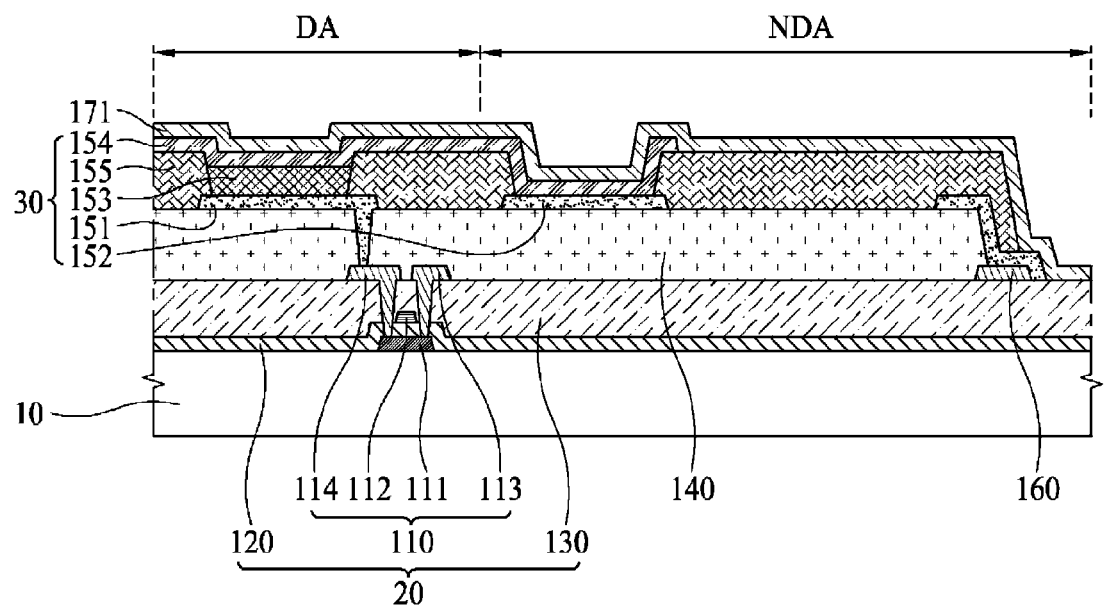

Fifth, as shown in FIG. 5F, the first inorganic film 171 is formed on the cathode electrode 154 of the display area DA and the bank 155 of the non-display area NDA. The first inorganic film 171 may be formed of a nitride material or oxide material, e.g. silicon nitride, aluminum nitride, zirconium nitride, titanium nitride, hafnium nitride, tantalum nitride, silicon oxide, aluminum oxide or titanium oxide.

Figure 5G:
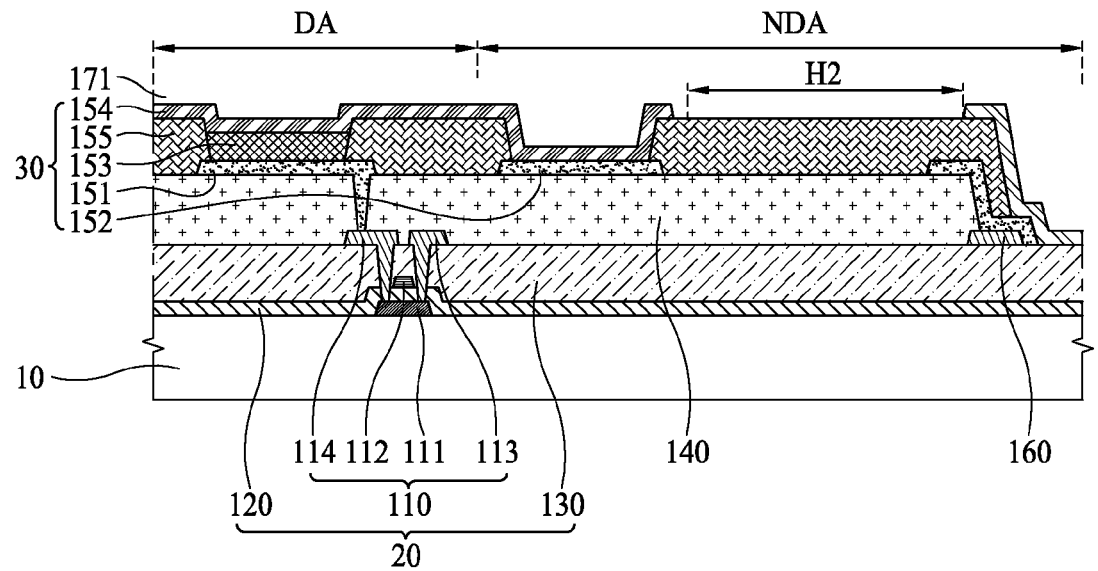
Figure 5H:
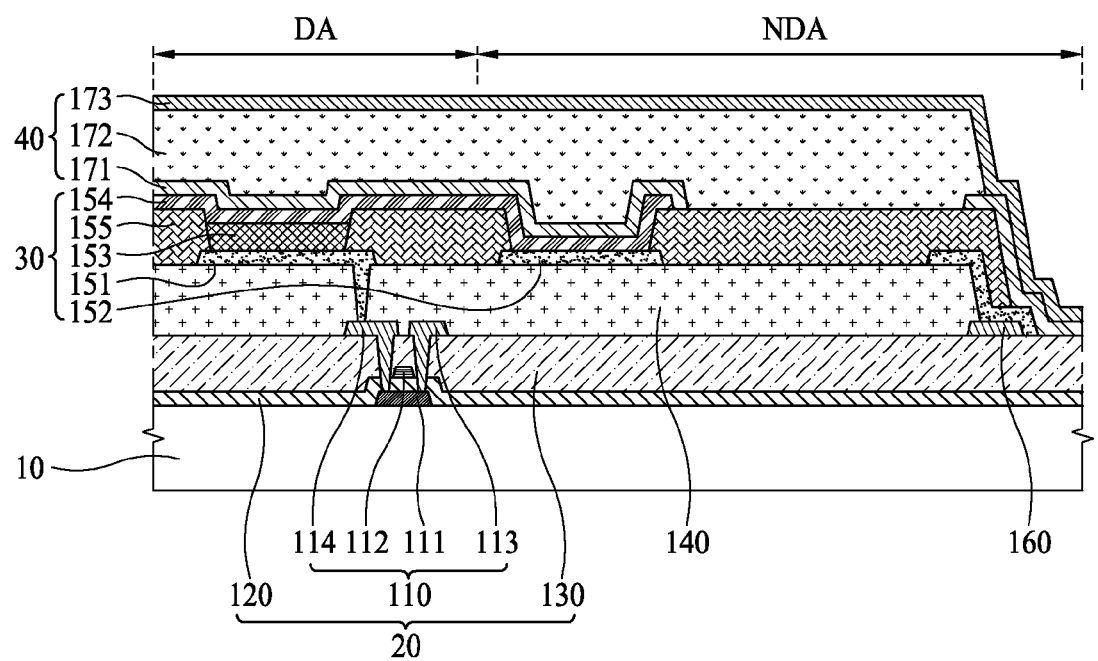

Meanwhile, the first inorganic film 171 provided in the non-display area NDA may be formed to partially expose the bank 155 provided on the planarization film 140 exposed by the first hole H1 as shown in FIG. 5G. In more detail, the second hole H2 that passes through the first inorganic film 171 provided in the non-display area NDA is formed. For example, the second hole H2 may be formed in the first inorganic film 172 through patterning the first inorganic film 172. The bank 155 is exposed through the second hole H2 (S106 and S107 of FIG. 4).

Sixth, as shown in FIG. 5H, the water absorption organic film 172 is formed on the first inorganic film 171 in the display area DA. The water absorption organic film 172 is formed on the first inorganic film 171 to prevent particles from being permeated into the organic light emitting layer 153 and the cathode electrode 154 by passing through the first inorganic film 171.

If the water absorption organic film 172 is provided in the display area DA and the non-display area NDA, the water absorption film 172 may be formed of a transparent and water-absorptive organic film to pass through light emitted from the organic light emitting layers 153 of the display area DA. For example, the water absorption organic film 172 may include an epoxy resin and an organometallic complex. A ratio of the epoxy resin to the organometallic complex, which are included in the water absorption organic film 172, may be, but not limited to, 9:1. That is, the ratio of the epoxy resin to the organometallic complex, which are included in the water absorption organic film 172, may be modified by the person skilled in the art within the range of design that may be modified.

Also, as shown in FIG. 5H, the water absorption organic film 172 is formed on the bank 155 exposed through the second hole H2. Thus, a path may be provided through which outgassing generated by the planarization film 140 may be transferred to the water absorption organic film 172, such that the outgassing may be absorbed by the water absorption organic film 172 if water remains in the planarization film 140. Therefore, in an example embodiment of the present invention, the organic light emitting diode or the cathode electrode may be prevented from being damaged by outgassing generated by water remaining in the planarization film.

Moreover, as shown in FIG. 5H, the second inorganic film 173 is formed on the water absorption organic film 172. The second inorganic film 173 may cover the first inorganic film 171 and the water absorption organic film 172. The second inorganic film 173 may be formed of a nitride material or oxide material, e.g. silicon nitride, aluminum nitride, zirconium nitride, titanium nitride, hafnium nitride, tantalum nitride, silicon oxide, aluminum oxide or titanium oxide (S108 of FIG. 4).

Figure 5I:
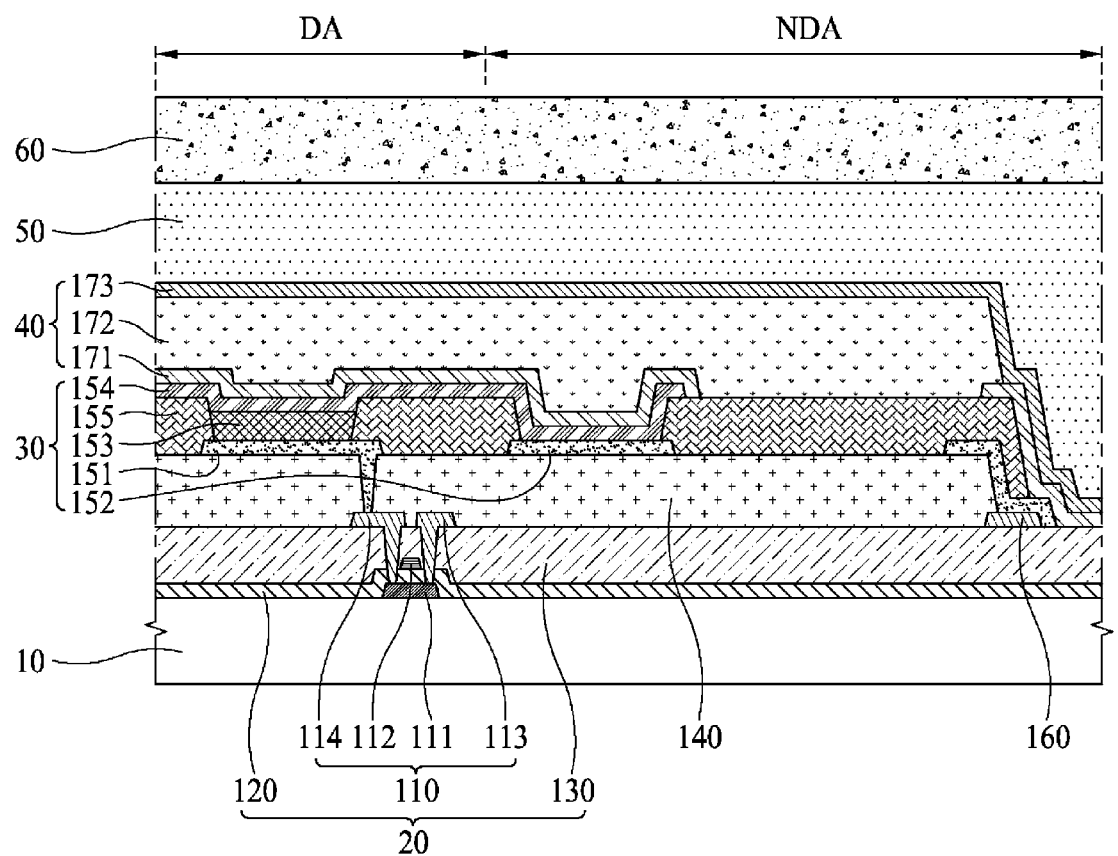

Seventh, as shown in FIG. 5I, the upper substrate 60 is bonded to the lower substrate 10 (provided with the thin film transistor layer 20, the organic light emitting diode layer 30 and the encapsulation layer 40) by means of the transparent adhesive layer 50. That is, the transparent adhesive layer 50 is deposited on the second inorganic film 173, and the upper substrate 60 is bonded onto the transparent adhesive layer 50 (S109 of FIG. 4).

As described above, according to an example embodiment of the present invention, the anode line 152 is formed in the non-display area NDA to partially expose the planarization film 140, the first inorganic film 171 is formed to partially expose the bank provided on the planarization film 140 which is partially exposed, and the water absorption organic film 172 is formed on the bank which is partially exposed. As a result, in an example embodiment of the present invention, the path may be provided through which outgassing generated by the planarization film 140 may be transferred to the water absorption organic film 172, and the outgassing may be absorbed by the water absorption organic film 172 if water remains in the planarization film 140. Therefore, in an example embodiment of the present invention, the organic light emitting diode or the cathode electrode may be prevented from being damaged by outgassing generated by water remaining in the planarization film.

FIG. 6 is a cross-sectional view illustrating an organic light emitting display device according to another example embodiment of the present invention. The display area DA and the non-display area NDA are partially shown in FIG. 6. Since a lower substrate 10, a thin film transistor layer 20, an organic light emitting diode layer 30, a first inorganic film 171, a second inorganic film 173, a transparent adhesive layer 50 and an upper substrate 60 of the organic light emitting display device according to another example embodiment of the present invention are substantially the same as those of the organic light emitting display device shown in FIG. 2, their description will be omitted.

Referring to FIG. 6, a transparent organic film 174 is provided on the first inorganic film 171 in the display area DA, and a water absorption organic film 172 is provided on a bank 155 partially exposed in the non-display area NDA.

For example, the transparent organic film 174 may be formed of epoxy, acrylate, urethaneacrylate, polyurea, polyacrylate, perylenetetracarboxylic dianhydride (PTCDA), biphenyl-tetracarboxylic acid dianhydride (BPDA) or pyromellitic dianhydride (PMDA).

The water absorption organic film 172 has a water absorption capability (e.g., water absorption rate) that is higher than that of the transparent organic film 174. For example, the water absorption organic film 172 may include an epoxy resin and an organometallic complex. A ratio of the epoxy resin to the organometallic complex, which are included in the water absorption organic film 172, may be, but not limited to, 9:1. That is, the ratio of the epoxy resin and the organometallic complex, which are included in the water absorption organic film 172, may be modified by the person skilled in the art within the range of design that may be modified.

If the water absorption organic film 172 is provided in the non-display area NDA only as shown in FIG. 6, the water absorption organic film 172 may be formed opaquely or with lower transmittance for visible light than the transparent organic film 174. Otherwise, if the water absorption organic film 172 had transparency lower than that of the transparent organic film 174, picture quality might be lowered due to the water absorption organic film 172 when the water absorption organic film 172 was provided in the display area DA. Therefore, in an example embodiment of the present invention, the water absorption organic film 172, which has low transmittance for visible light or is opaque, is provided in the non-display area NDA while the transparent organic film 174 which has high transparency is provided in the display area DA, whereby picture quality may be maintained and at the same time the organic light emitting diode or the cathode electrode may be prevented from being damaged by outgassing generated by water remaining in the planarization film.

In the example embodiment shown in FIG. 6, the bank 155 is disposed between the planarization film 140 and the water absorption organic film 172. However, as already described in connection with the embodiment of FIG. 2, it is to be understood that in accordance with one or more embodiments, the bank 155 may not need to be disposed between the planarization film 140 and the water absorption organic film 172. For example, one or more other layers may be disposed between the planarization film 140 and the water absorption organic film 172 instead of the bank 155, for example as long as the water absorption organic film 172 can at least partially absorb outgassing generated in the planarization film 140.

Also, in one or more embodiments, one or more other layers may be disposed between the planarization film 140 and the water absorption organic film 172 in addition to the bank 155. Also, in one or more embodiments, the bank 155 may have an opening (hole), and the water absorption organic film 172 may fill the opening so as to contact the planarization film 140. The opening (hole) may expose a sub-portion of the portion of the planarization film exposed by the anode line 152, and wherein the water absorption organic film fills the hole so as to contact said sub-portion. For example, the water absorption organic film may be in direct mechanical contact with the planarization film 140 via the hole in the bank 155.

Also, in one or more embodiments, the bank 155 may be omitted, and the water absorption organic film 172 may be in direct mechanical contact with the planarization film 140.

Illustratively, and as described herein above, in accordance with various embodiments, the water absorption organic film 172 may be provided as a moisture-absorbing layer above the planarization film 140 and may be configured to at least partially absorb moisture created by the planarization film 140. To this end, the layer arrangement including the planarization film 140 and the water absorption organic film 172 (and possibly, one or more other layers such as, e.g., the bank 155, the first inorganic film 171, or others) may be configured such that a moisture-carrying path is provided leading from the planarization film 140 (i.e., the moisture-creating film) to the water absorption organic film 172 (i.e., the moisture-absorbing film).

FIG. 7 is a flow chart illustrating a method of fabricating an organic light emitting display device according to another example embodiment of the present invention. FIGS. 8A to 8K are cross-sectional views illustrating a method of fabricating an organic light emitting display device according to another example embodiment of the present invention. Hereinafter, the method of fabricating an organic light emitting display device according to another embodiment of the present invention will be described in detail with reference to FIGS. 8A to 8K.

Since steps S201 to S207 of FIG. 7 and description of FIGS. 8A to 8G are substantially the same as the steps S101 to S107 of FIG. 4 and the description of FIGS. 5A to 5G, their description will be omitted.

Figure 8A:
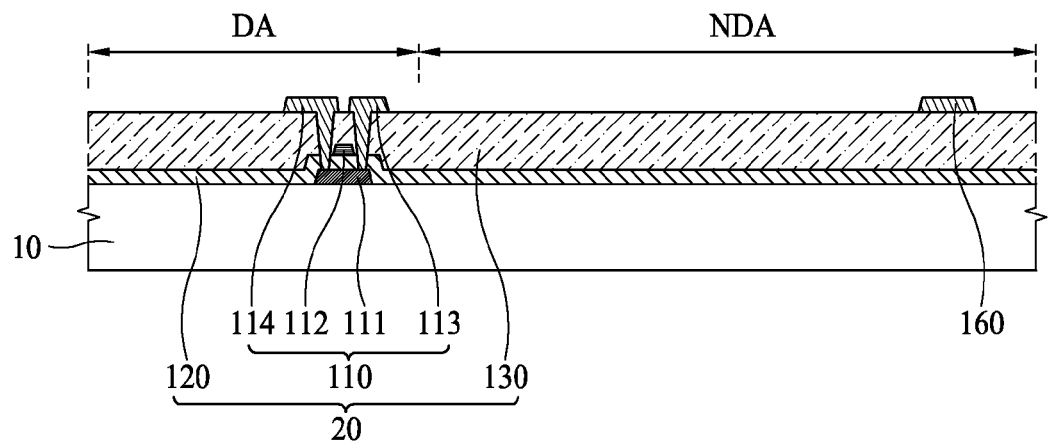
FIGS. 8A to 8K are cross-sectional views illustrating a method of fabricating an organic light emitting display device according to another embodiment of the present invention.
Figure 8B:
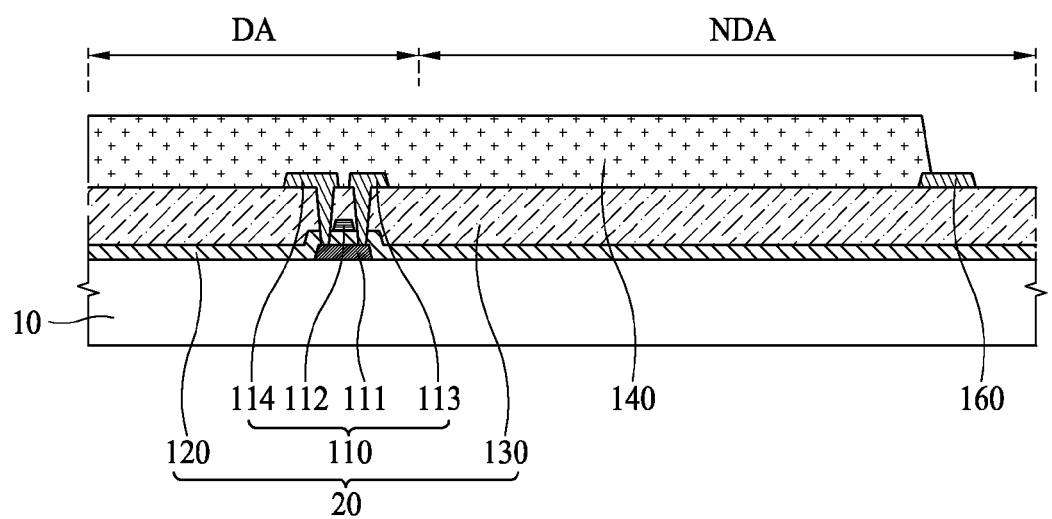
Figure 8C:
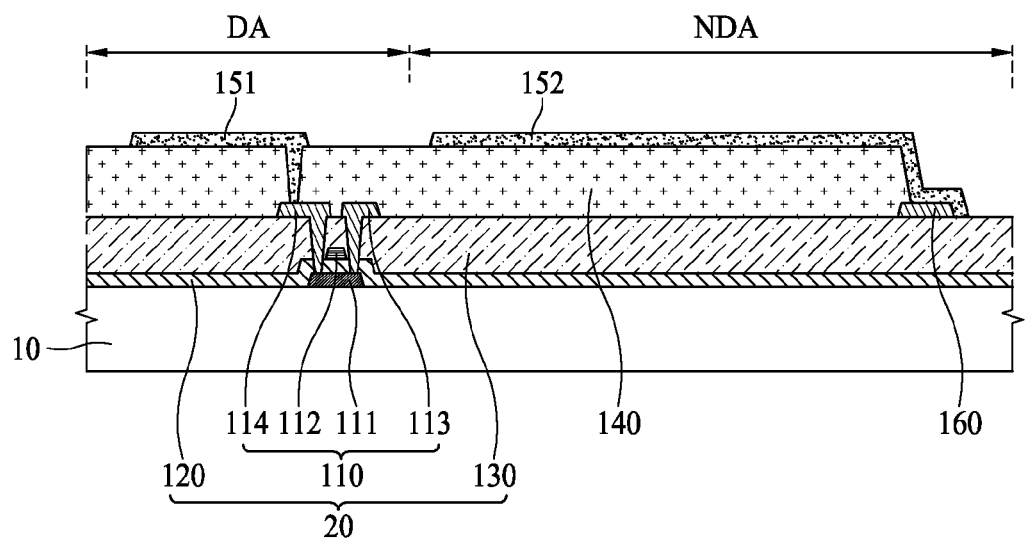
Figure 8D:
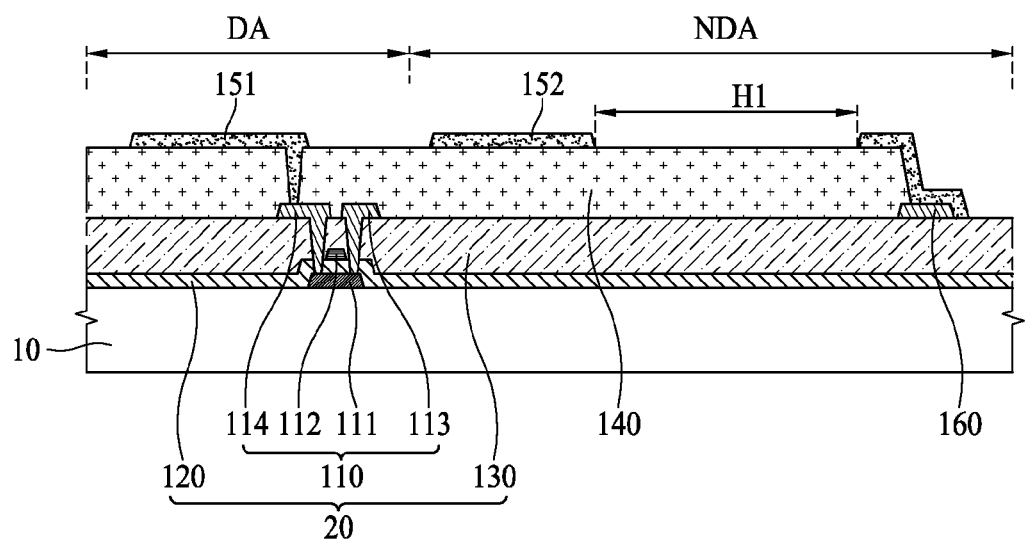
Figure 8E:
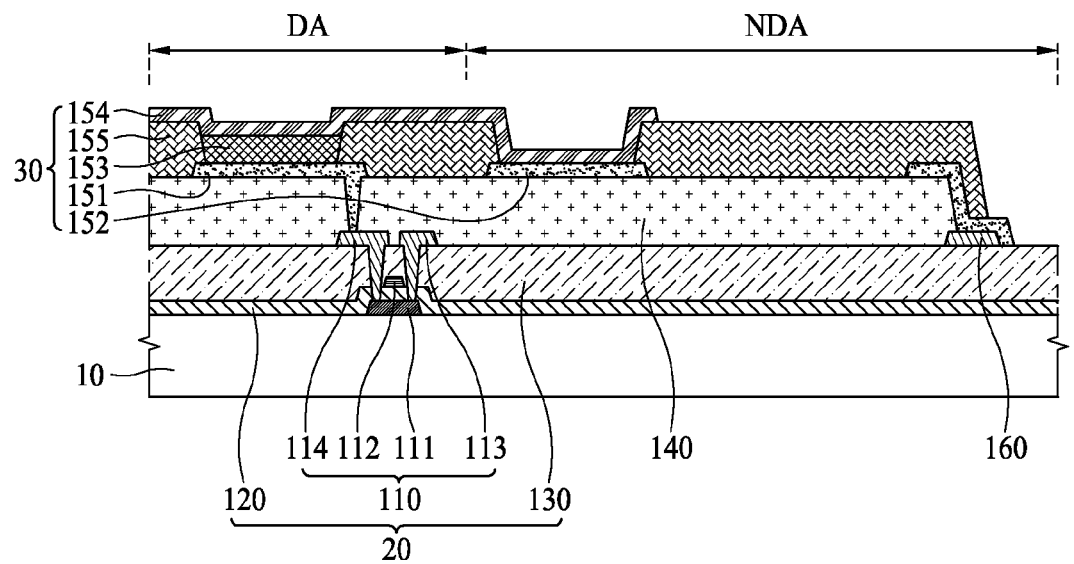
Figure 8F:
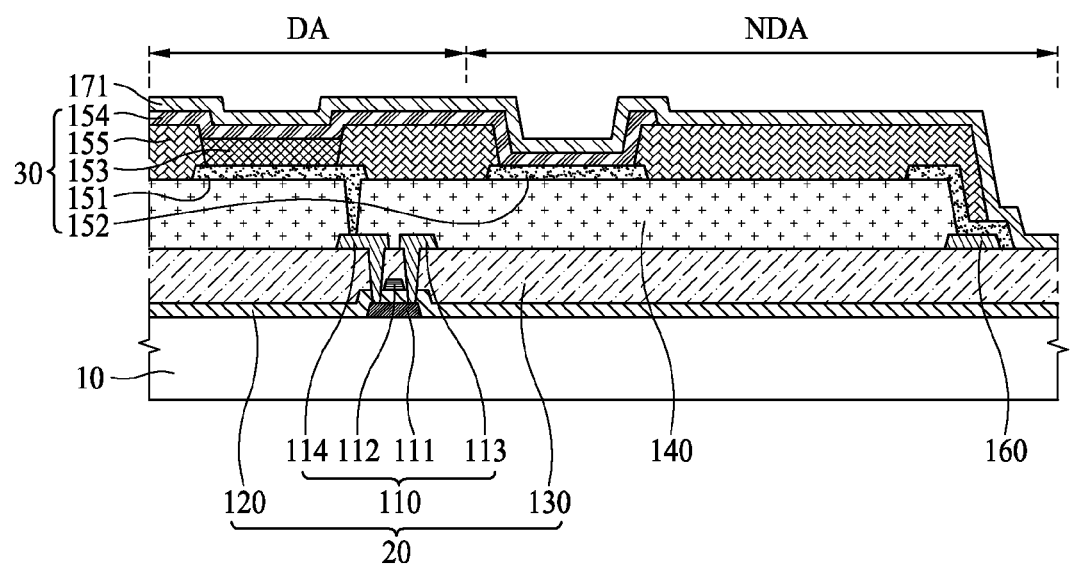
Figure 8G:
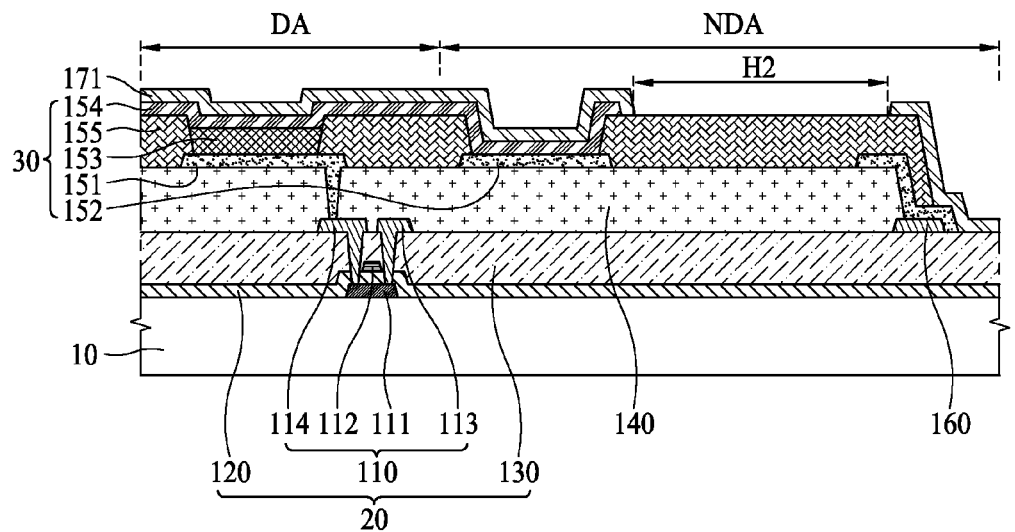
Figure 8H:
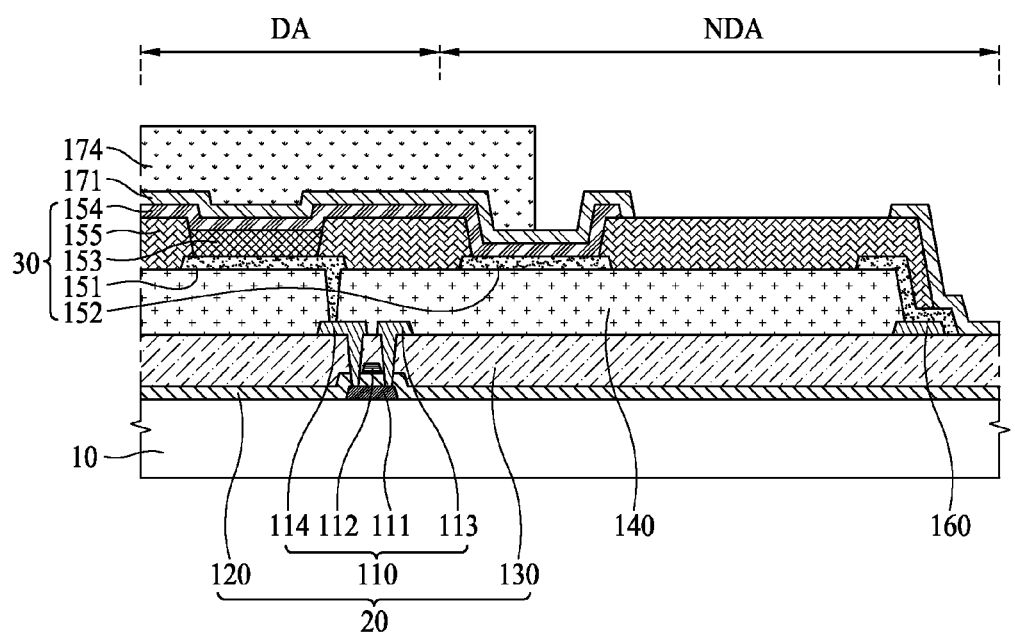

As shown in FIG. 8G, after the second hole H2 passing through the first inorganic film 171 is formed, the transparent organic film 174 is formed on the first inorganic film 171 in the display area DA as shown in FIG. 8H. The transparent organic film 174 is to prevent particles from being permeated into the light emitting layer 153 and the cathode electrode 154 after passing through the first inorganic film 171. As shown, a portion of the transparent organic film 174 may be located in the non-display area NDA.

For example, the transparent organic film 174 may be formed of epoxy, acrylate, urethaneacrylate, polyurea, polyacrylate, PTCDA, BPDA or PMDA (S208 of FIG. 7).

Figure 8I:
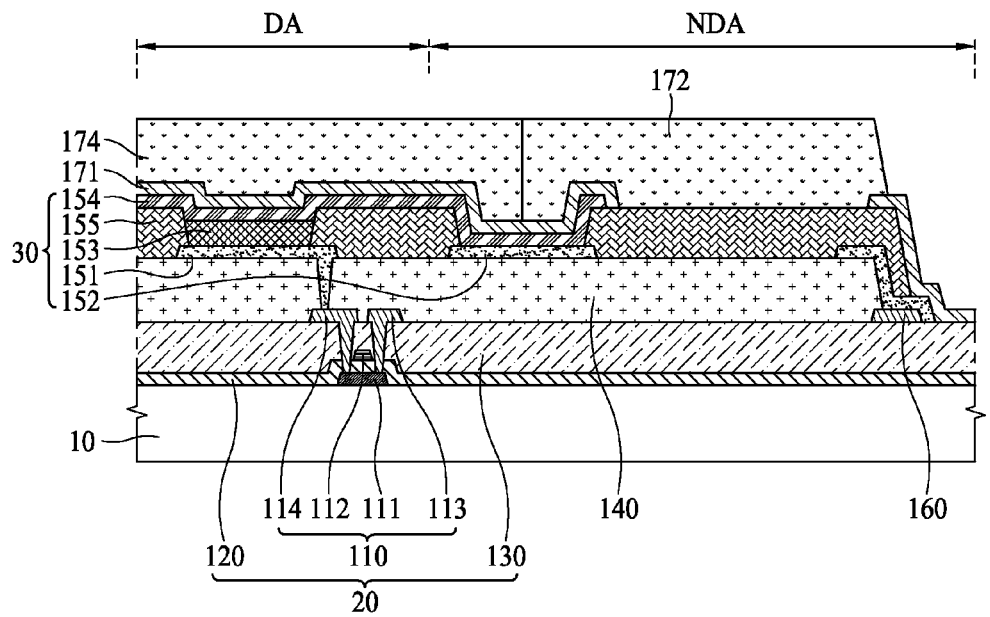

Then, as shown in FIG. 8I, the water absorption organic film 172 is formed on the bank 155 exposed through the second hole H2 of the non-display area NDA. The water absorption organic film 172 may be formed of an absorptive organic film. For example, the water absorption organic film 172 may include an epoxy resin and an organometallic complex. A ratio of the epoxy resin to the organometallic complex, which are included in the water absorption organic film 172, may be, but not limited to, 9:1. That is, the ratio of the epoxy resin to the organometallic complex, which are included in the water absorption organic film 172, may be modified by the person skilled in the art within the range of design that may be modified.

If the water absorption organic film 172 is provided in the non-display area NDA only as shown in FIG. 8I, the water absorption organic film 172 may be formed opaquely or with lower transmittance for visible light than the transparent organic film 174. Otherwise, if the water absorption organic film 172 had transparency lower than that of the transparent organic film 174, picture quality might be lowered due to the water absorption organic film 172 when the water absorption organic film 172 was provided in the display area DA. Therefore, in an example embodiment of the present invention, the water absorption organic film 172, which has low transmittance for visible light or is opaque, is provided in the non-display area NDA while the transparent organic film 174 which has high transparency is provided in the display area DA, whereby picture quality may be maintained and at the same time the organic light emitting diode or the cathode electrode may be prevented from being damaged by outgassing generated by water remaining in the planarization film (S209 of FIG. 7).

Figure 8J:
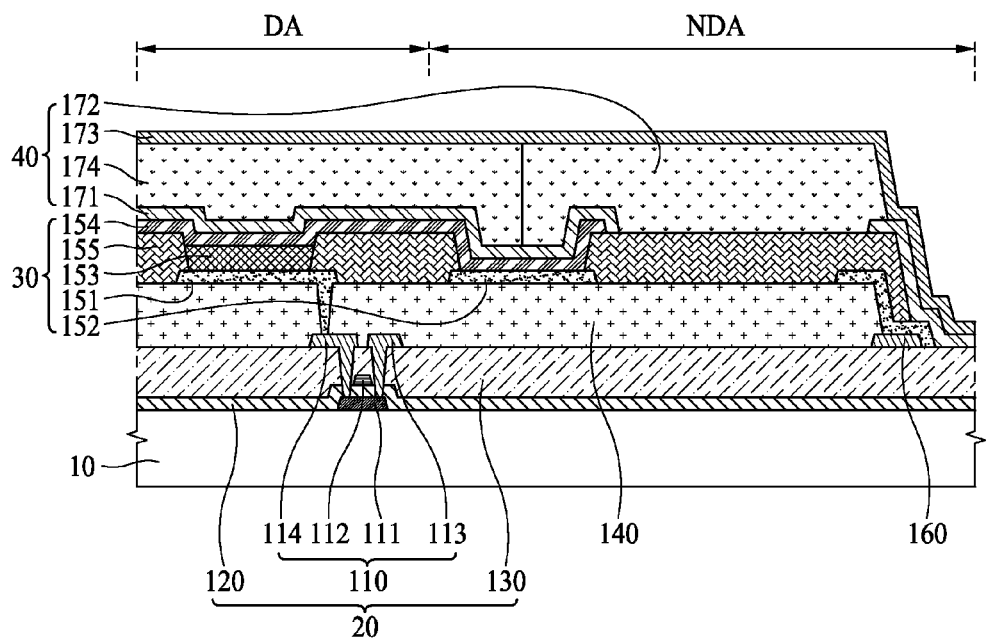

Then, as shown in FIG. 8J, the second inorganic film 173 is formed on the water absorption organic film 172. The second inorganic film 173 may cover the first inorganic film 171 and the water absorption organic film 172. The second inorganic film 173 may be formed of a nitride material or oxide material, e.g. silicon nitride, aluminum nitride, zirconium nitride, titanium nitride, hafnium nitride, tantalum nitride, silicon oxide, aluminum oxide or titanium oxide (S210 of FIG. 7).

Figure 8K:
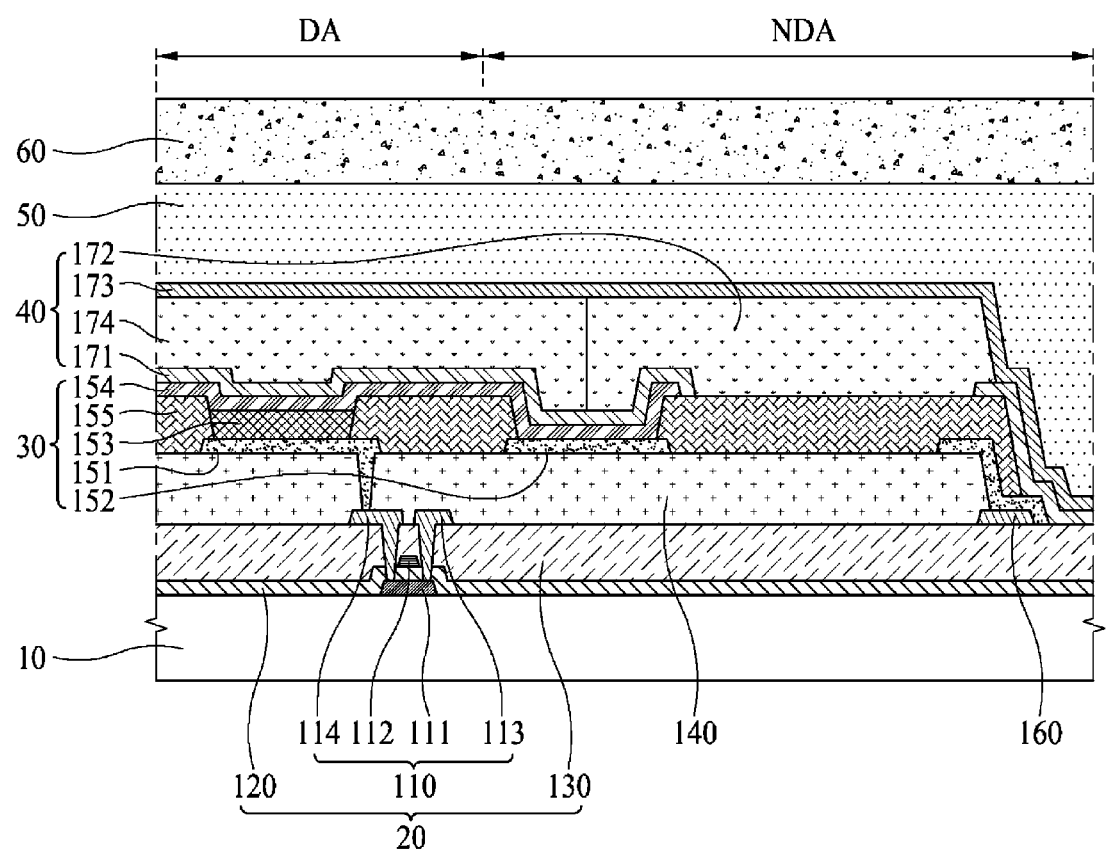

Afterwards, as shown in FIG. 8K, the upper substrate 60 is bonded to the lower substrate 10 (provided with the thin film transistor layer 20, the organic light emitting diode layer 30 and the encapsulation layer 40) by means of the transparent adhesive layer 50. That is, the transparent adhesive layer 50 is deposited on the second inorganic film 173, and the upper substrate 60 is bonded onto the transparent adhesive layer 50 (S211 of FIG. 7).

As described above, according to an example embodiment of the present invention, the anode line 152 is formed in the non-display area NDA to partially expose the planarization film 140, the first inorganic film 171 is formed to partially expose the bank 155 provided on the planarization film 140 which is partially exposed, and the water absorption organic film 172 is formed on the bank 155 which is partially exposed. As a result, in an example embodiment of the present invention, the path may be provided through which outgassing generated by the planarization film 140 may be transferred to the water absorption organic film 172, and the outgassing may be absorbed by the water absorption organic film 172 if water remains in the planarization film 140. Therefore, in the embodiment of the present invention, the organic light emitting diode or the cathode electrode may be prevented from being damaged by outgassing generated by water remaining in the planarization film.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a substrate;
   a thin film transistor layer provided on the substrate;
   a planarization film provided on the thin film transistor layer to planarize the thin film transistor layer;
   an anode line provided on the planarization film that exposes a portion of the planarization film in a non-display area of the display device corresponding to a periphery area outside a display area of the display device;
   a bank provided on the portion of the planarization film exposed by the anode line;
   an inorganic film provided on the bank that exposes a portion of the bank in the non-display area; and
   a water absorption organic film provided on the portion of the bank exposed by the inorganic film, and comprising an organic material that is configured to at least partially absorb outgassing from the planarization film.

2. The organic light emitting display device of claim 1, wherein the water absorption organic film is in direct mechanical contact with the portion of the bank exposed by the inorganic film.

3. The organic light emitting display device of claim 1, wherein the portion of the bank exposed by the inorganic film at least partially overlaps the portion of the planarization layer exposed by the anode line.

4. The organic light emitting display device of claim 1, wherein the anode line comprises a first hole for exposing the portion of the planarization film in the non-display area, wherein the first hole is filled by the bank.

5. The organic light emitting display device of claim 4, wherein the inorganic film comprises a second hole for exposing the portion of the bank in the non-display area, wherein the second hole is filled by the water absorption organic film.

6. The organic light emitting display device of claim 1, wherein the water absorption organic film is in direct mechanical contact with the portion of the planarization film exposed by the anode line.

7. The organic light emitting display device of claim 1, wherein the water absorption organic film includes an epoxy resin and an organometallic complex,
   wherein a ratio between the epoxy resin and the organometallic complex is 9:1.

8. The organic light emitting display device of claim 1, wherein the water absorption organic film is provided in the display area and the non-display area.

9. The organic light emitting display device of claim 1, wherein the water absorption organic film is provided in the non-display area only.

10. The organic light emitting display device of claim 9, further comprising a transparent organic film provided in the display area adjacent to the water absorption organic film,
  wherein the water absorption organic film has a water absorption capability that is higher than that of the transparent organic film, and
  wherein the transparent organic film comprises at least one of epoxy, acrylate, urethaneacrylate, polyurea, polyacrylate, perylenetetracarboxylic dianhydride (PTCDA), biphenyl-tetracarboxylic acid dianhydride (BPDA) or pyromellitic dianhydride (PMDA).

11. An organic light emitting display device comprising:
  a substrate;
  a thin film transistor layer provided on the substrate;
  a planarization film provided on the thin film transistor layer to planarize the thin film transistor layer;
  an anode line provided on the planarization film that exposes a portion of the planarization film in a non-display area of the display device corresponding to a periphery area outside a display area of the display device;
  a bank provided on the portion of the planarization film exposed by the anode line; and
  a water absorption organic film provided on the portion of the planarization film exposed by the anode line, and comprising an organic material that is configured to at least partially absorb outgassing from the planarization film,
  wherein the bank defines a hole that exposes a sub-portion of the portion of the planarization film exposed by the anode line, wherein the water absorption organic film fills the hole so as to contact said sub-portion, and
  wherein the water absorption organic film is in direct mechanical contact with the planarization film via the hole in the bank.

12. A method of fabricating an organic light emitting display device, the method comprising:
  forming a thin film transistor layer on a substrate;
  forming a planarization film on the thin film transistor layer for planarizing the thin film transistor layer;
  forming an anode line on the planarization film that exposes a portion of the planarization film in a non-display area of the display device corresponding to a periphery area outside a display area of the display device;
  forming a bank on the portion of the planarization film exposed by the anode line; and
  forming an inorganic film on the bank that exposes a portion of the bank in the non-display area;
  forming a water absorption organic film on the portion of the bank exposed by the inorganic film, wherein the water absorption organic film comprises an organic material that is configured to at least partially absorb outgassing from the planarization film.

13. The method of claim 12,
  wherein:
  forming the anode line on the planarization film includes forming a first hole in the anode line for exposing the portion of the planarization film in the non-display area after forming the anode line on the planarization film, and
  forming the bank on the portion of the planarization film exposed by the anode line includes filling the first hole with the bank, and
  wherein:
  forming the inorganic film on the bank includes forming a second hole in the bank for exposing the portion of the bank in the non-display area after forming the inorganic film on the bank, and
  forming the water absorption organic film on the portion of the bank exposed by the inorganic film includes filling the second hole with the water absorption organic film.

14. The method of claim 12, further comprising:
  forming the water absorption organic film in the non-display area only, and
  forming a transparent organic film in the display area adjacent to the water absorption organic film, wherein the water absorption organic film has a water absorption capability that is higher than that of the transparent organic film.

15. The method of claim 12, wherein the water absorption organic film includes an epoxy resin and an organometallic complex,
  wherein a ratio between the epoxy resin and the organometallic complex is 9:1.

16. The method of claim 12,
  wherein the water absorption organic film is formed in direct mechanical contact with the portion of the bank exposed by the inorganic film.

17. A method of fabricating an organic light emitting display device, the method comprising:
  forming a thin film transistor layer on a substrate;
  forming a planarization film on the thin film transistor layer for planarizing the thin film transistor layer;
  forming an anode line on the planarization film that exposes a portion of the planarization film in a non-display area of the display device corresponding to a periphery area outside a display area of the display device;
  forming a bank on the portion of the planarization film exposed by the anode line; and
  forming a water absorption organic film on the portion of the planarization film exposed by the anode line, wherein the water absorption organic film comprises an organic material that is configured to at least partially absorb outgassing from the planarization film,
  wherein the bank defines a hole that exposes a sub-portion of the portion of the planarization film exposed by the anode line,
  wherein the water absorption organic film fills the hole so as to contact said sub-portion, and
  wherein the water absorption organic film is in direct mechanical contact with the planarization film via the hole in the bank.

* * * * *